(12) United States Patent
Chawla et al.

(10) Patent No.: US 9,021,324 B2
(45) Date of Patent: Apr. 28, 2015

(54) CALIBRATION ARRANGEMENT

(75) Inventors: Nitin Chawla, Noida (IN); Kallol Chatterjee, Kolkata (IN); Chittoor Parthasarathy, Nodia (IN)

(73) Assignee: STMicroelectronics International N.V., Amsterdam (NL)

( * ) Notice: Subject to any disclaimer, the term of this patent is extended or adjusted under 35 U.S.C. 154(b) by 457 days.

(21) Appl. No.: 12/974,409

(22) Filed: Dec. 21, 2010

(65) Prior Publication Data

US 2012/0158339 A1 Jun. 21, 2012

(51) Int. Cl.
*G01R 31/28* (2006.01)
*G06F 1/32* (2006.01)
*G06F 11/30* (2006.01)
*G11C 29/02* (2006.01)

(52) U.S. Cl.
CPC ............ *G06F 1/3206* (2013.01); *G11C 29/023* (2013.01); *G06F 1/324* (2013.01); *G06F 1/3296* (2013.01); *G06F 11/3024* (2013.01); *G06F 11/3058* (2013.01); *Y02B 60/1217* (2013.01); *Y02B 60/1285* (2013.01)

(58) Field of Classification Search
USPC ..................................... 714/731; 702/89, 107
See application file for complete search history.

(56) References Cited

U.S. PATENT DOCUMENTS

| | | | | |
|---|---|---|---|---|
| 2006/0263913 | A1* | 11/2006 | Marshall | 438/14 |
| 2008/0307277 | A1* | 12/2008 | Tschanz et al. | 714/726 |
| 2010/0182055 | A1* | 7/2010 | Rozen et al. | 327/155 |
| 2010/0333057 | A1* | 12/2010 | Tang et al. | 716/126 |
| 2011/0296266 | A1* | 12/2011 | Song et al. | 714/731 |
| 2012/0124363 | A1* | 5/2012 | Dietrich et al. | 713/100 |

OTHER PUBLICATIONS

Author: Junyoung Park and Jacob A. Abraham; Title: A Fast, Accurate and Simple Critical Path Monitor for Improving Energy-Delay Product in DVS Systems; Date: 2011; Publisher: 978-1-61284-660-6/11 © 2011 IEEE.*
Tschanz, James et al., Tunable Replica Circuits and Adaptive Voltage-Frequency Techniques for Dynamic Voltage, Temperature, and Aging Variation Tolerance, 2009 Symposium on VLSI Circuits Digest of Technical Papers, pp. 112-113.

* cited by examiner

*Primary Examiner* — April Y Blair
*Assistant Examiner* — Thien D Nguyen
(74) *Attorney, Agent, or Firm* — Allen, Dyer, Doppelt, Milbrath & Gilchrist, P.A.

(57) ABSTRACT

An arrangement including at least one path, at least one replica path, the at least one replica path corresponding to a respective path, a controller configured to use control information derived from the at least one replica path, at least one of the paths comprising a monitoring unit configured to provide monitor information to the controller, the controller being configured to modify the control information in dependence on the monitor information.

24 Claims, 3 Drawing Sheets

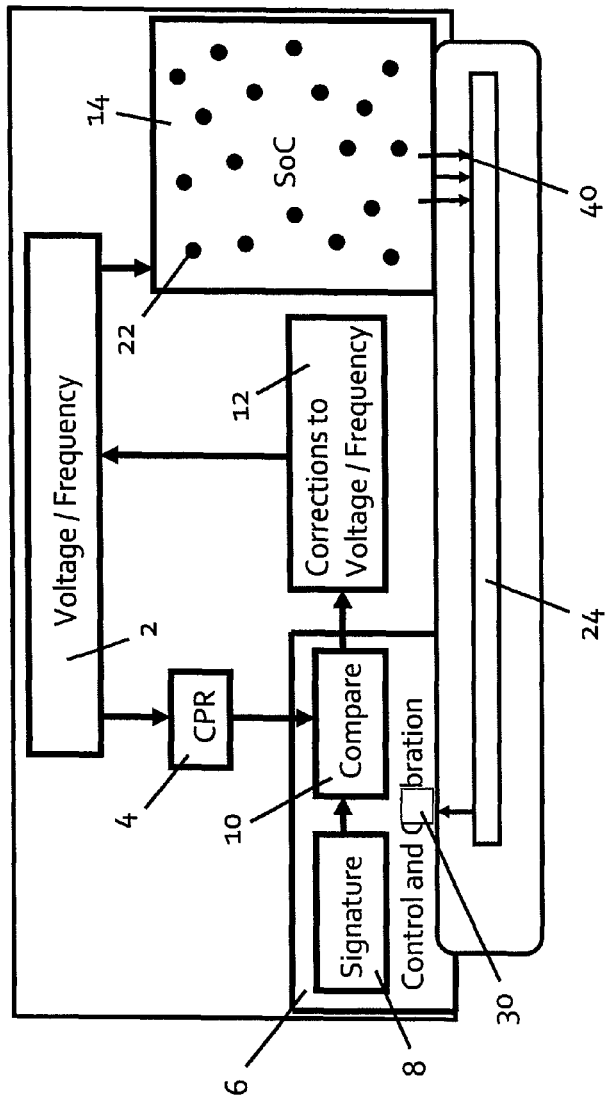
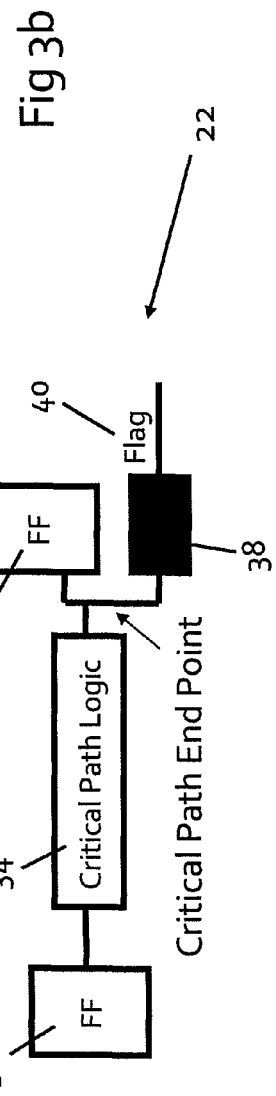
Fig 3a
Fig 3b

CALIBRATION ARRANGEMENT

BACKGROUND OF THE INVENTION

1. Field of the Invention

The present invention relates to an arrangement and in particular but not exclusively to an arrangement in an integrated circuit using replica paths.

2. Discussion of the Related Art

Reference is made to "Tunable Replica Circuits and Adaptive Voltage-Frequency Techniques for Dynamic Voltage, Temperature, and Aging Variation Tolerance" 2009 Symposium on VLSI Circuits Digest of Technical Papers, James Tschanz et al. This paper describes tunable replica circuits used in conjunction with error-detection sequentials, and dynamic voltage and frequency techniques to adapt to voltage and aging problems.

Known processor designs are arranged to have built in margins to ensure that the integrated circuit operates in the worst conditions. These margins are operating voltage margins and frequency margins. However these margins mean that when the integrated circuit is operating in more favorable conditions, the integrated circuit is not operating in an optimum manner. The margins mean that for some of the time the performance is reduced (speed of operation) and/or the integrated circuit is energy inefficient (the voltage is higher than it needs to be.)

SUMMARY OF THE INVENTION

According to a first aspect, there is provided an arrangement comprising: at least one path; at least one replica path, said at least one replica path corresponding to a respective path; a controller configured to use control information derived from said at least one said replica path; at least one of said paths comprising a monitoring unit configured to provide monitor information to said controller, said controller being configured to modify said control information in dependence on said monitor information.

According to a second aspect, there is provided an integrated circuit comprising at least one path; at least one replica path, said at least one replica path corresponding to a respective path; a controller configured to use control information derived from said at least one said replica path; at least one of said paths comprising a monitoring unit configured to provide monitor information to said controller, said controller being configured to modify said control information in dependence on said monitor information.

According to a third aspect, there is provided a method comprising:

monitoring at least one path and providing monitor information; using control information derived from at least one replica path wherein the at least one replica path corresponds to a respective at least one path; and modifying the control information in dependence on said monitor information.

According to a fourth aspect, there is provided an arrangement comprising: at least one path; at least one replica path, said at least one replica path corresponding to a respective path; control means for using control information derived from said at least one said replica path; at least one of said paths comprising monitoring means for providing monitor information to said control means, said control means for modifying said control information in dependence on said monitor information.

According to a fifth aspect, there is provided a method comprising:

providing by a monitoring unit of at least one path monitor information to a controller; using by the controller control information derived from at least one replica path wherein the at least one replica path corresponds to a respective at least one path; and modifying by the controller the control information in dependence on said monitor information.

BRIEF DESCRIPTION OF THE DRAWINGS

Some embodiments will now be described by way of example only to the accompanying Figures in which:

FIG. 3a shows a schematic view of an embodiment of a calibration arrangement; and FIG. 3b shows an example of a critical path of the embodiment of FIG. 3.

DETAILED DESCRIPTION

Figure 1:
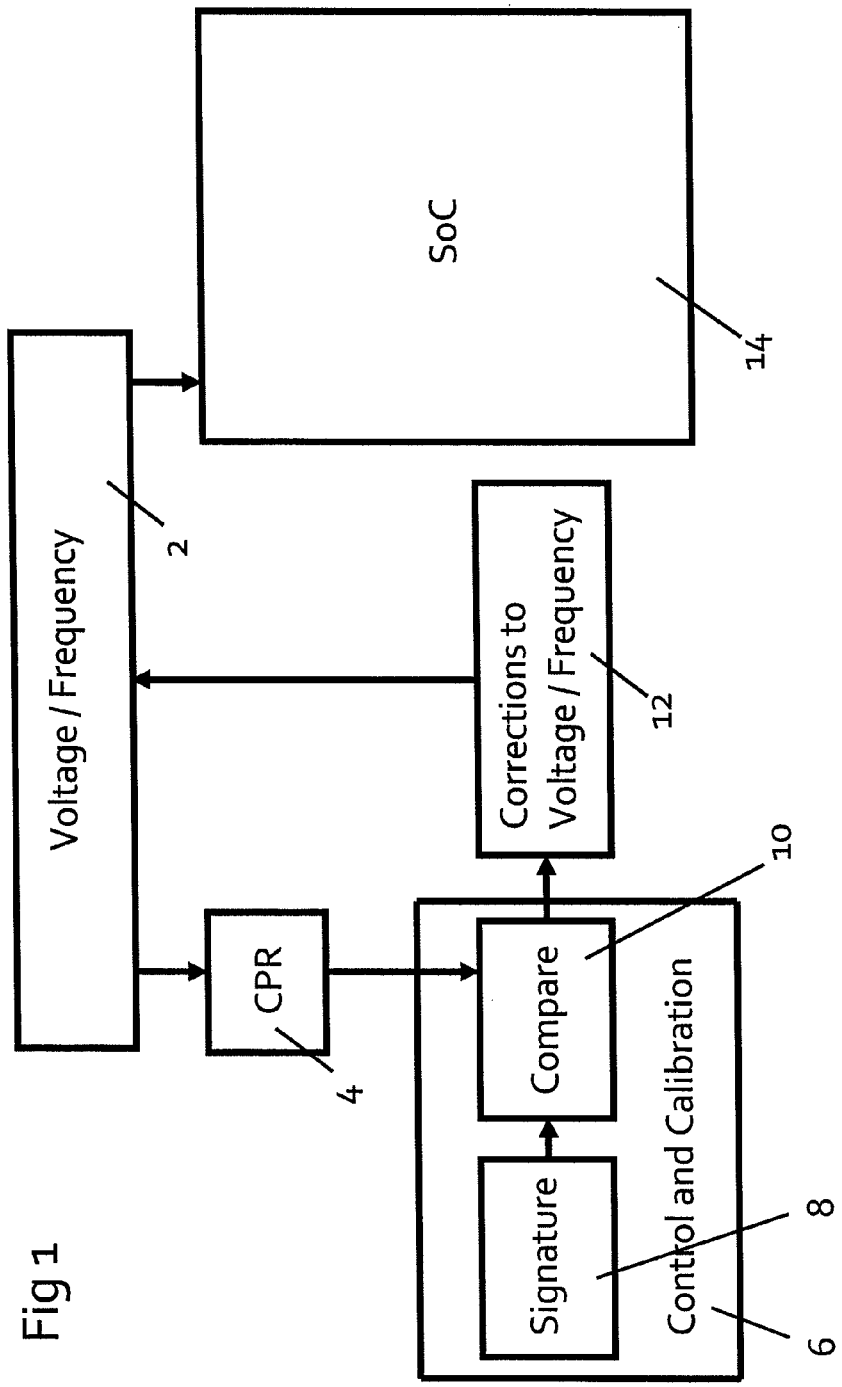
FIG. 1 shows a schematic view of a current calibration arrangement.

Reference is first made to FIG. 1 which shows a current calibration arrangement provided on an integrated circuit 1. The integrated circuit 1 is provided with a system on chip SoC 14. The SoC 14 has a number of critical paths. These critical paths may correspond to logic on the SoC 14 with the highest delay that limits the clock frequency at which the circuit may operate in certain conditions. Conditions affecting the operating speed of a circuit may be the supply voltage of the SoC 14 and/or temperature conditions of the SoC 14. In other words, the critical path may determine the speed at which the SoC 14 may operate. The logic corresponding to the critical path may provide a different delay based on operating conditions of the SoC 14. These operating conditions may be for example temperature and/or factors influencing the SoC 14 over time. Margins for parameters such as operating voltage and frequency of a SoC 14 may be included to account for the variations of the delay provided by the critical path. Generally the margins are provided for a worst case scenario of the delay in the critical path. The margins of the operating voltage and/or frequency may not result in the optimum operation of the SoC 14.

The SoC 14 is provided with a voltage signal. The voltage signal has a level which is controlled by a voltage/frequency controller 2. The SoC 14 is also provided with one or more clock signals, the frequency of which is controlled by the voltage/frequency controller 2.

The integrated circuit is also provided with a plurality of replicas 4 of at least some of the critical paths. The replica paths 4 have the same logical components or logical components which can provide the same delay as the corresponding critical paths. The replica paths 4 are generally provided only for test purposes. The replica paths 4 are provided with the same voltage and clock signal(s) as the critical paths of the SoC 14. The voltage and/or frequency controller 2 is configured to control the voltage and/or frequency of signals applied and/or used by the replica paths 4.

The critical path replicas 4 are provided to enable the margins to be reduced during the operation of the integrated circuit. This may be achieved by having multiple delay chains comprising various cells to reflect the heterogeneous nature of the SoC 14. Thermometer test code may enable multipoint calibration and can be used to measure the failure position at environmental extremes. Interpolation may be used to calculate the failure bit position in between these readings. This reduces the error. The critical path replica 4 may provide sensitivity to voltage, process variations, temperature, NBTI, Negative Bias Temperature Instability and/or workload while allowing the system to respond and adapt to these noise processes.

In an ideal scenario, the critical path replica 4 tracks exactly the maximum frequency of the microprocessor and only one calibration measurement would need to be taken. However in an actual environment, this assumption may not be valid. The behavior of the integrated circuit will change over time and/or change in dependence on environmental conditions. In some implementations, the critical path is located at different physical locations on the integrated circuit to the replica path 4. This means that the behavior of the critical path and the replica critical path 4 are not the same. Accordingly some margin needs to be built into the frequency and/or voltage level to take this into account.

As mentioned, to ensure the correct operation of the integrated circuit, margins are built into the parameters of operation. This may be, for example, that to ensure a particular behaviour, the voltage level is higher than it might actually need to be. If the voltage level is higher than it actually needs to be, then the power consumption goes up and the energy efficiency goes down.

Figure 2:
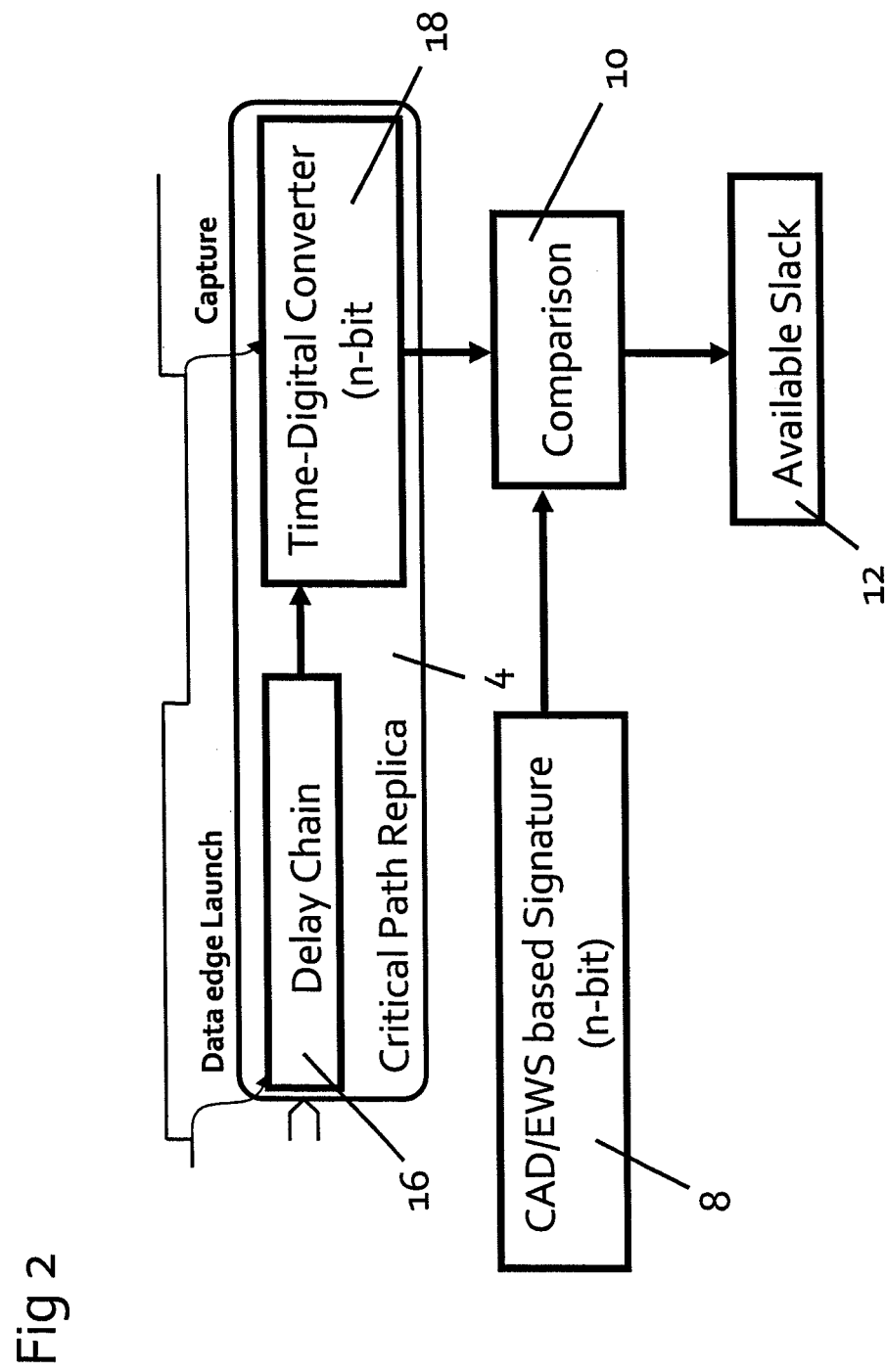
FIG. 2 shows a block diagram illustrating the functionality of the calibration arrangement of FIG. 1.

The arrangement of FIGS. 1 and 2 is configured to provide a critical path replica based adaptive system. The arrangement is responsive to margins indicated by the replica to adapt the voltage and/or frequency. In this arrangement, information may be available every clock cycle. In practice, there is some skew between the replica path and the critical path that may show up as an error which is accounted for in these margins.

With the arrangement of FIGS. 1 and 2, it may not be possible to use a lower voltage and be sure that the arrangement will operate correctly, due to this skewing. Alternatively or additionally to ensure a particular behavior, the frequency (i.e. clock signal) may be lower than it actually needs to be. If the frequency is lower, the performance is not as fast as it could be, again due to this skewing.

The outputs of the replica critical paths 4 are provided to a controller 6. The controller 6 has a store 8 which is arranged to store signature information associated with each of the replica paths 4. The controller 6 also has a comparator 10. The comparator 10 is configured to compare the signature data for a respective replica path 4 with the data which has been output by that path 4. The results of the comparison are used by function 12 to determine a correction to the voltage and/or frequency. The function 12 may be a lookup table, processor or any other suitable arrangement.

The signature data may be a reference value corresponding to a critical path. The signature data may represent an output of the critical path under optimum parameter input conditions. In other words, when an optimum frequency and optimum voltage are used to drive the circuit, the output of a critical path will match a signature data corresponding to that critical path. If the output of the critical path and the signature data do not match, it can be assumed that the voltage and frequency used to drive the circuit need to be adjusted.

The output of the function 12 is provided to the voltage/frequency controller 2 which changes the voltage/frequency of the path associated with the respective replica path.

Reference is made to FIG. 2 which schematically shows part of the arrangement of FIG. 1 in more detail. The store 8 is configured to store signature data which is CAD/EWS (computer aided design/Electrical Wafer Sort). This data is thus provided in the design and test stage of the integrated circuit or block. The replica path 4 comprises a delay chain 16 in this arrangement. A Time-Digital n-bit converter 18 is configured to capture the output data of the delay chain 16 and provide the data to the comparator 10 which also receives the signature data for that replica path. From that information, the function 12 is configured to determine if there is any slack in the margins which would permit the voltage to be decreased and/or the frequency to be increased.

It should be appreciated that the receipt of a data edge by the delay chain 16 triggers the providing of the data to the comparator 10.

Reference will now be made to FIGS. 3a and 3b which illustrate an embodiment. It should be appreciated that those parts of the integrated circuit which are the same as described in relation to FIGS. 1 and 2 have the same reference. This embodiment may address a problem of spatial and/or temporal mismatches between the critical replica path and the actual critical paths. This mismatch may lead to complex delay chains in an effort to replicate as much as possible the actual critical path.

Alternatively or additionally embodiments may address the problem that the selected CAD/EWS data of the arrangement of FIGS. 1 and 2 is selected for the entire lifetime of the chip and may therefore result in a less than optimal performance of the integrated circuit.

As with the arrangement of FIGS. 1 and 2, a voltage and/or frequency controller is provided which is configured to control the voltage and/or clock frequency. The replica paths 4 are arranged to have a clock frequency and/or voltage controlled by the voltage/frequency controller 2 as is the SoC 14. The SoC 14 has a plurality of critical paths 22 which are schematically illustrated in FIG. 3b. At an input to the critical path 22 is a first flip-flop 32. An output of the first flip-flop 32 is coupled to an input of critical path logic 34. The output of the critical path logic 34 is coupled to the input of a second flip-flop 35 as well as an in situ monitor 38. The in situ monitor 38 is configured to provide a flag 40 in response to the detection of an error condition.

In one embodiment of the invention, an error flag is provided if the data which is input to second flip-flop has changed within a window of a clock edge. In other words there is some uncertainty that the correct data has been captured on the clock edge. The data changing within the window of the clock edge may be indicative of many types of runtime errors that may manifest as the above timing error.

The flags 40 from the various critical paths are output from the SoC 14 (see FIG. 3a) into a data pipeline 24. The data pipeline 24 is arranged to provide the flag results to a processor 30 in the controller 6.

As with the arrangement shown in FIGS. 1 and 2, the controller 6 has a signature data store 8 and a comparator 10. The comparator 10 is again arranged to compare the signature data in the data store 8 with the data received from the replica path 4. However a comparison is also made with the data from the replica path 4 and the flag data 40. If the data from the replica path 4 indicates that there is an error condition, but the flag data 40 indicates that there is no problem then it can be determined that there is no need to reduce the frequency and/or increase the power. In fact, it may be possible to increase the frequency and/or decrease the power. Likewise, if the data from the replica path 4 indicates that there no error condition but the flag data 40 indicates that there is a problem then it can be determined that is a need to reduce the frequency and/or increase the power.

In one embodiment, this is achieved by modifying the signature data. In some embodiments of the invention, it may change the signature data in response to the determination of a single discrepancy. In other embodiments, the signature may be altered only if a discrepancy has occurred a predetermined number of times. The output of the controller 6 is input to the function 12 which is arranged to provide information on the corrections required to the voltage and/or frequency. It should be appreciated that a clock signal is provided to the controller 6, the SoC 14 and the data pipeline 24. The frequency of the clock is controlled by the voltage/frequency controller 2.

In some embodiments the signature data is modified by comparing a raised flag 40 from pipeline 24 and the output from the critical path replica 4 against the reference signature. This comparison may be carried out digitally. The comparison may determine a difference between the signature and a condition present amongst the critical paths 22. The condition present amongst the critical paths 22 may be indicated by flag 40. The reference signature may be assigned a new value to bring it in line with the condition of the critical path 22. The critical path replica output may now be compared against this calibrated value, until any new difference between the signature and the condition present amongst the critical paths 22 is determined and the signature is modified further.

In some embodiments, a network of in-situ sensors 38 is placed at the various critical path end points. The firing of one or more of the sensors 38 provides the opportunity to judge the quality of the signature. This also provides the opportunity to re-calibrate as required. The critical paths 22 maybe inactive for some time over which the integrated circuit is in operation. To save energy or power, the critical paths 22 may have the clock signal to the critical path 22 suppressed. In some embodiments, the clock signal is fired specifically so as to generate an output for the sensor 38 to check. Thus the monitors can be used in a test mode.

It should be appreciated that the flags from the sensors can be pipelined in order to take into account the propagation delay. The pipeline 24 may diminish any delay between the raising of the flag and the input of a flag value 40 at controller 6 for comparison. In such a manner the signature may be compared to the value of the flag at the time the flag was raised. The pipeline may avoid any latency introduced due to the propagation of the flag logic to the input of the controller. In some embodiments, the pipeline 24 may act as an input to a co-processor for analyzing the statistical occurrence of flags. For example, the co-processor may be dedicated to finding correlations between occurrence of flags to the ambient and work-load conditions. For example, if burst mode processing at very high speed is activated, the statistical correlation to the occurrence of the flag can be studied.

It should be appreciated that in some embodiments. both the voltage and the frequency of the clock signal(s) may be controlled by the voltage/frequency controller 2. However, in some alternative embodiments, only one of the voltage or frequency may be controlled.

In some embodiments of the invention, all of the critical paths 22 may be provided with respective replica paths 4. However, in alternative embodiments of the invention, only some of the critical paths 22 maybe provided with a corresponding replica path 4. In some embodiments, more than one critical path 22 has the same construction. In that case, those critical paths 22 which have the same construction may share a common replica path 4.

In know design flows, there are many types of critical paths 22 which would make it difficult to replicate all them. This can be addressed by the choice of delay chains. Thus because of the in situ monitors 38, in may be possible to approximate a critical path 22 with a delay chain. This may make the integrated circuit easier to design.

It should be appreciated that the store can comprise a register or registers, a look up table or any suitable type of memory. In alternative embodiments of the invention, the signature data can be stored in a fuse bank. In embodiments incorporating a fuse bank or other non-volatile memory, data pertaining to the characteristics of the critical path and change in frequency and/or voltage over a time period may be stored for subsequent use after the power is removed from the integrated circuit.

It should be appreciated that While the above arrangements have the critical paths 22 provided on an SoC, alternatively or additionally the critical paths may be provided elsewhere on the integrated circuit.

Some embodiments may provide a non intrusive arrangement. Thus the existing designs used for some blocks of the SoC 14 do not need to be modified, in some embodiments to incorporate the additional monitoring. Some embodiments may provide continuous monitoring on the integrated circuit, for example of the SoC 14. The monitoring provided on the integrated circuit may be real time. Some embodiments may be used over the entire life of the integrated circuit.

Some embodiments of the invention may provide one or more of the following advantages: Optimal, that is energy efficient, SoC performance; Address the problems due to the mismatch of critical path replicas and the actual critical paths; Simplifies replica design.

Embodiments allow a simplified critical replica path to be used in that the need to choose a large combination of cells and R-C values in the replica path. Instead a simple replica path can be used. The replica path will have good resolution at the high frequencies where the clock period is small.

An intelligent adaptive system is provided which able to adapt to changing environmental conditions and/or change in the characteristics of the integrated circuits over time; and provides a method of debugging timing issues. The monitors may be monitoring units and may be used as debugging elements during a test mode of the system on chip.

In some embodiments, the controller 6 can assimilate information on statistical dependence of calibration requirements with respect to its own chip. The controller may map the occurrence of flags 40 to input vector patterns. The input vector patterns may correspond to operating modes giving raise to flags or spatial locations for various types of computations. The occurrence of flags may also or alternatively be mapped to ambience—for example, the flag can be correlated to temperature changes (detected through independent thermal sensors) or to supply changes (detected through independent voltage sensors).

While this detailed description has set forth some embodiments of the present invention, the appended claims cover other embodiments of the present invention which differ from the described embodiments according to various modifications and improvements. Other applications and configurations may be apparent to the person skilled in the art.

Such alterations, modifications, and improvements are intended to be part of this disclosure, and are intended to be within the spirit and scope of the invention. Accordingly, the foregoing description is by way of example only and is not intended as limiting. The present invention is limited only as defined in the following claims and the equivalents thereto.

What is claimed is:
1. An arrangement comprising:
a first path comprising a monitoring unit configured to provide monitor information;
a first replica path corresponding to the first path;
a voltage/frequency controller coupled to the first path and the first replica path and configured to control at least one of voltage and frequency; and a controller coupled to the monitoring unit and the first replica path and comprising
    a memory configured to store a first signature corresponding to the first replica path, and
    a comparator coupled to the memory and configured to compare the monitor information from the monitoring unit with an output of the first replica path and compare the stored first signature with the output of the first replica path,
the controller configured to modify, during operation, the stored first signature in response to the comparison of monitor information;
the voltage/frequency controller being configured to control the at least one of voltage and frequency for the first path in response to the comparison of the stored first signature.

2. An arrangement as claimed in claim 1, wherein said first path comprises critical path logic.

3. An arrangement as claimed in claim 1, wherein said monitoring unit is configured to provide monitor information in response to detection of an error condition.

4. An arrangement as claimed in claim 3, wherein said error condition comprises a timing error.

5. An arrangement as claimed in claim 3, wherein said monitoring unit is configured to determine if there is a transition in a data signal within a time window of a clock edge.

6. An arrangement as claimed in claim 3, wherein said monitoring unit is configured to assert a flag in response to the detection of an error condition.

7. An arrangement as claimed in claim 1, further comprising at least one further path wherein comprising a monitoring unit.

8. An arrangement as claimed in claim 1, wherein said first replica path comprises a delay chain.

9. An arrangement as claimed in claim 1, wherein the first path comprises a first critical path, and wherein said arrangement is configured to have a test mode in which said first critical path is activated to provide test data.

10. An arrangement as claimed in claim 1, further comprising at least one further monitoring unit coupled to the monitoring unit to define a network of monitoring units.

11. An integrated circuit comprising:
a first path comprising a monitoring unit configured to provide monitor information;
a first replica path corresponding to the first path;
a voltage/frequency controller coupled to first path and the first replica path and configured to control at least one of voltage and frequency; and
a controller coupled to the monitoring unit and the first replica path and comprising
    a memory configured to store a first signature corresponding to the first replica path, and
    a comparator coupled to the memory and configured to compare the monitor information from the monitoring unit with an output of the first replica path and compare the stored first signature with the output of the first replica path,
the controller configured to modify, during operation, the stored first signature in response to the comparison of monitor information;
the voltage/frequency controller being configured to control the at least one of voltage and frequency for the first path in response to the comparison of the stored first signature.

12. An integrated circuit as claimed in claim 11, comprising a system on chip, said first path being provided in said system on chip.

13. An integrated circuit as claimed in claim 12, wherein said system on chip is configured to provide a plurality of outputs from a plurality of monitoring units, said plurality of outputs being placed in a data pipeline coupled to said controller.

14. A method comprising:
monitoring a first path and providing monitor information from the first path;
storing, in a memory, a first signature corresponding to a first replica path corresponding to the first path;
comparing, using a comparator coupled to the memory, the monitor information from the first path with an output of the first replica path and comparing, using the comparator, the stored first signature with the output of the first replica path;
modifying, during operation of a controller, the stored first signature in response to the comparison of monitor information; and
controlling, using a voltage/frequency controller, at least one of a voltage and frequency for the first path in response to the comparison of the stored first signature, the voltage/frequency controller coupled to the first path and the first replica path and configured to control the at least one of voltage and frequency.

15. A method as claimed in claim 14 wherein providing monitor information further comprises detecting an error condition and generating monitor information in response to said error condition.

16. A method as claimed in claim 15 wherein detecting an error condition comprises detecting a timing error.

17. A method as claimed in claim 15 wherein detecting a timing error further comprising determining if there is a transition in a data signal within a time window of a clock edge.

18. A method as claimed in claim 15, further comprising asserting a flag in response to the detection of an error condition.

19. An arrangement as claimed in claim 1, wherein the monitoring unit is configured to compare a first output of the first path with a second output of the first path, the first and second outputs being output at different times.

20. An integrated circuit as claimed in claim 11, wherein the monitoring unit is configured to compare a first output of the first path with a second output of the first path, the first and second outputs being output at different times.

21. A method as claimed in claim 14, wherein said monitor information is based on a comparison of a first output of the at least one path and a second output of the at least one path, the first and second outputs being output at different times.

22. A method as claimed in claim 14, wherein said replica path comprises a delay chain.

23. A method as claimed in claim 14 wherein the first path comprises a critical path; and wherein the method further comprises activating the critical path to provide test data in a test mode.

24. An arrangement as claimed in claim 1, wherein the first signature represents an output of the first path under certain operating conditions.

* * * * *